US012609279B2

(12) United States Patent
Distaso et al.

(10) Patent No.: US 12,609,279 B2
(45) Date of Patent: Apr. 21, 2026

(54) IN-SITU ION BEAM ANGLE MEASUREMENT

(71) Applicant: Applied Materials, Inc., Santa Clara, CA (US)

(72) Inventors: Daniel Distaso, Rowley, MA (US); Thomas Soldi, Somerville, MA (US); Joseph C. Olson, Beverly, MA (US)

(73) Assignee: Applied Materials, Inc., Santa Clara, CA (US)

( * ) Notice: Subject to any disclaimer, the term of this patent is extended or adjusted under 35 U.S.C. 154(b) by 440 days.

(21) Appl. No.: 18/236,711

(22) Filed: Aug. 22, 2023

(65) Prior Publication Data

US 2025/0069850 A1 Feb. 27, 2025

(51) Int. Cl.
H01J 37/08 (2006.01)
H01J 37/317 (2006.01)
H01L 21/66 (2006.01)

(52) U.S. Cl.
CPC .......... H01J 37/3171 (2013.01); H01J 37/08 (2013.01); H01L 22/12 (2013.01); *H01J 2237/24528* (2013.01); *H01J 2237/31701* (2013.01)

(58) Field of Classification Search
CPC .. H01J 37/08; H01J 37/3171; H01J 2237/245; H01J 2237/24514; H01J 2237/24528; H01J 2237/24535; H01J 2237/24542; H01J 2237/24564; H01J 2237/24571; H01J 2237/24578; H01J 2237/24585; H01J 2237/31701; H01J 22/12
See application file for complete search history.

(56) References Cited

U.S. PATENT DOCUMENTS

| | | | | |
|---|---|---|---|---|
| 7,479,644 | B2 * | 1/2009 | Ryding | ................ H01J 37/244 |
| | | | | 250/397 |
| 11,508,552 | B2 * | 11/2022 | Kamoshida | ......... H01J 37/3053 |
| 2003/0197132 | A1 | 10/2003 | Keum et al. | |
| 2006/0076510 | A1 | 4/2006 | Chang et al. | |

(Continued)

FOREIGN PATENT DOCUMENTS

| | | |
|---|---|---|
| CN | 101051086 A | 10/2007 |
| TW | 200636794 A | 10/2006 |

(Continued)

OTHER PUBLICATIONS

International Search Report and Written Opinion mailed Oct. 28, 2024 in corresponding PCT application No. PCT/US2024/038649.

*Primary Examiner* — Sean M Luck
(74) *Attorney, Agent, or Firm* — Nields, Lemack & Frame, LLC

(57) ABSTRACT

A processing system that includes an ion source to direct an ion beam at a workpiece, and an angle measurement system, is disclosed. The angle measurement system includes a current measurement device, such as one or more Faraday sensors, that may be moved in at least two orthogonal directions. The current measurement device scans in a first direction, seeking the largest current measurement. The current measurement device then moves to a second position in the second direction and repeats the scanning procedure. Based on data collected at two different locations in the second direction, the angle of incidence of the incoming ion beam may be determined.

18 Claims, 8 Drawing Sheets

(56)           References Cited

U.S. PATENT DOCUMENTS

| | | |
|---|---|---|
| 2006/0219955 A1 | 10/2006 | Ray |
| 2009/0289193 A1 | 11/2009 | Yamashita |
| 2021/0066020 A1 | 3/2021 | Kamoshida et al. |
| 2022/0028647 A1 | 1/2022 | Floresca et al. |
| 2025/0069850 A1* | 2/2025 | Distaso ................... H01J 37/08 |

FOREIGN PATENT DOCUMENTS

| | | | |
|---|---|---|---|
| WO | 2008/001685 A1 | 1/2008 | |
| WO | 2013/095811 A1 | 6/2013 | |

* cited by examiner

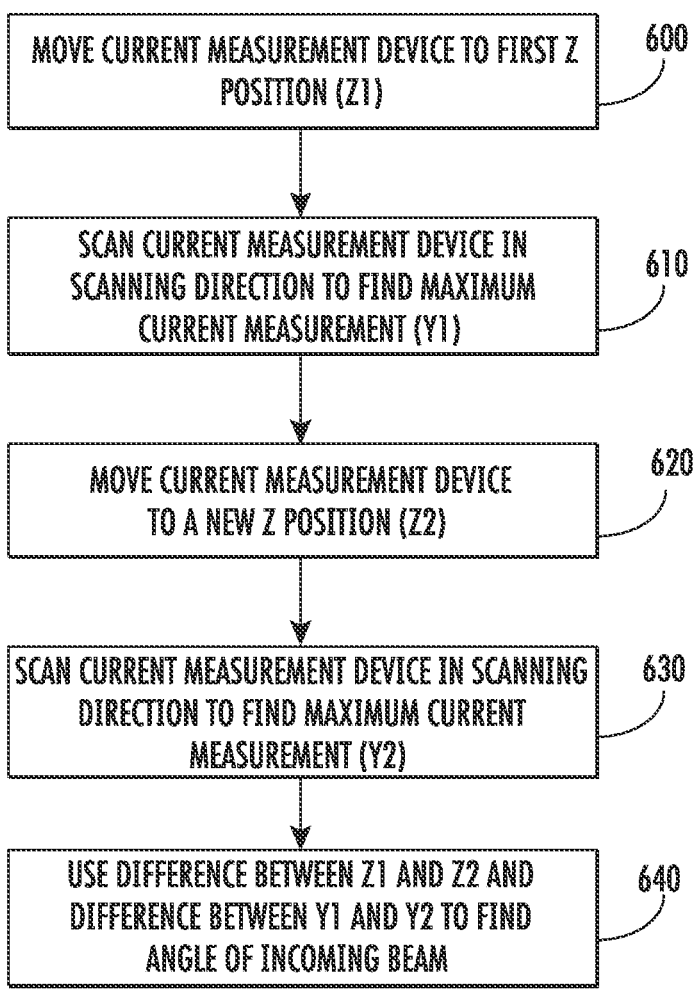

MOVE CURRENT MEASUREMENT DEVICE TO FIRST Z POSITION (Z1) — 600

SCAN CURRENT MEASUREMENT DEVICE IN SCANNING DIRECTION TO FIND MAXIMUM CURRENT MEASUREMENT (Y1) — 610

MOVE CURRENT MEASUREMENT DEVICE TO A NEW Z POSITION (Z2) — 620

SCAN CURRENT MEASUREMENT DEVICE IN SCANNING DIRECTION TO FIND MAXIMUM CURRENT MEASUREMENT (Y2) — 630

USE DIFFERENCE BETWEEN Z1 AND Z2 AND DIFFERENCE BETWEEN Y1 AND Y2 TO FIND ANGLE OF INCOMING BEAM — 640

FIG. 6

MOVE CURRENT MEASUREMENT DEVICE
TO A NEW Z POSITION (Zi) (i=1,2,3,...)          700

SCAN CURRENT MEASUREMENT DEVICE IN HEIGHT
DIRECTION TO FIND MAXIMUM MEASUREMENT
(Yi) (i=1,2,3,...)          710

GENERATE LINE OF BEST FIT BASED ON 3 OR
MORE POINTS (Yi,Zi) (i=1,2,3,...)          720

USE SLOPE OF BEST FIT LINE TO FIND ANGLE OF
INCOMING BEAM          730

IN-SITU ION BEAM ANGLE MEASUREMENT

FIELD

Embodiments of the present disclosure relate to a processing system that computes the ion beam angle of incidence using a movable current measurement device.

BACKGROUND

Many processes utilize an ion beam that is directed toward a workpiece, such as a semiconductor wafer, to perform some process on the workpiece. In some of these processes, the ion beam is perpendicular to the surface of the workpiece. However, in other embodiments, it may be desirable to have the ion beam impact the workpiece at an angle that is not perpendicular to the workpiece.

Furthermore, certain processes may advantageously be performed at a specific angle, different from perpendicular. This may be useful in certain processes such as etching, ion implantation, and others. For these processes, it may be desirable to determine the exact angle at which the beam is impacting the workpiece. This information may be use for tuning or characterization purposes.

Therefore, it would be beneficial if there was a processing system that includes an ion source and an angle measurement system, where the angle measurement system was adapted to measure the angle of incidence of the incoming ion beam. Further, it would be advantageous if this angle measurement system was suitable for large angles of incidence.

SUMMARY

A processing system that includes an ion source to direct an ion beam at a workpiece, and an angle measurement system, is disclosed. The angle measurement system includes a current measurement device, such as one or more Faraday sensors, that may be moved in at least two orthogonal directions. The current measurement device scans in a first direction, seeking the largest current measurement. The current measurement device then moves to a second position in the second direction and repeats the scanning procedure. Based on data collected at two different locations in the second direction, the angle of incidence of the incoming ion beam may be determined.

According to one embodiment, a processing system is disclosed. The processing system comprises an ion source to create an ion beam having a width and a height; a current measurement device wherein the ion beam is directed toward the current measurement device and impacts the current measurement device at an angle different from a perpendicular angle; a scanning motor to move the current measurement device in a direction that is orthogonal to the width of the ion beam, referred to as a scanning direction, wherein a position of the current measurement device in the scanning direction is referred to as a scanning position; a Z direction motor to move the current measurement device in a direction that is orthogonal to a surface of the current measurement device; and a controller configured to: move the current measurement device to a first position in a Z direction ($Z1$) using the Z direction motor; determine a first scanning position ($Y1$) that results in a greatest detected current while the current measurement device is located at the first position in the Z direction ($Z1$); move the current measurement device to a second position in the Z direction ($Z2$) using the Z direction motor; determine a second scanning position ($Y2$) that results in a greatest detected current while the current measurement device is located at the second position in the Z direction ($Z2$); and use $Y1$, $Y2$, $Z1$ and $Z2$ to determine an angle of incidence of the ion beam. In some embodiments, the controller determines a scanning position that results in the greatest detected current by actuating the scanning motor such that the current measurement device moves in the scanning direction, and recording a detected current at a plurality of scanning positions while the current measurement device is moving. In some embodiments, the angle of incidence is calculated based on a ratio of ($Y2$-$Y1$) to ($Z2$-$Z1$). In some embodiments, the controller is configured to: move the current measurement device to at least one additional position in the Z direction ($Z3$) using the Z direction motor; determine at least a third scanning position ($Y3$) that results in a greatest detected current while the current measurement device is located at the at least one additional position; and create a line of best fit using values of $Z1$, $Z2$, $Z3$, $Y1$, $Y2$ and $Y3$, wherein a slope of the line of best fit is used to determine the angle of incidence. In some embodiments, the processing system comprises extraction optics disposed outside an extraction aperture of the ion source, and the controller uses the angle of incidence to move the extraction optics to achieve a desired angle of incidence. In some embodiments, the processing system comprises a motor to rotate at least a portion of the ion source, and the controller uses the angle of incidence to rotate at least the portion of the ion source to achieve a desired angle of incidence. In some embodiments, the controller is configured to: collect a plurality of current measurements taken at a plurality of scanning positions while the current measurement device is at the first position in the Z direction ($Z1$) and the second position in the Z direction ($Z2$); and calculate an angular spread of the ion beam based on the plurality of current measurements. In some embodiments, the controller is configured to: determine a third and fourth scanning position ($Y3$, $Y4$) that result in a detected current equal to two predetermined percentiles of a total beam current while the current measurement device is located at the first position in the Z direction ($Z1$); determine a fifth and sixth scanning position ($Y5$, $Y6$) that results in a detected current equal to the two predetermined percentiles of the total beam current while the current measurement device is located at the second position in the Z direction ($Z2$); and calculate an angular spread of the ion beam based on $Y3$, $Y4$, $Y5$, $Y6$, $Z1$ and $Z2$. In some embodiments, the current measurement device comprises an array of Faraday sensors arranged in a width direction of the ion beam. In some embodiments, the ion source is part of a beam line ion implanter. In some embodiments, the angle of incidence is defined as $90°$ minus the angle between the ion beam and the scanning direction. In some embodiments, the processing system comprises a workpiece holder in communication with the scanning motor and the Z direction motor, wherein the current measurement device is affixed to the workpiece holder.

According to another embodiment, a method of determining an angle of incidence of an ion beam is disclosed. The method comprises determining a first scanning position ($Y1$) where a current detected by a current measurement device is a maximum while the current measurement device is at a first Z position ($Z1$); determining a second scanning position ($Y2$) where a current detected by the current measurement device is a maximum while the current measurement device is at a second Z position ($Z2$); and using $Y1$, $Y2$, $Z1$ and $Z2$ to determine the angle of incidence of the ion beam. In some embodiments, the angle of incidence is calculated based on a ratio of (Y2-Y1) to (Z2-Z1). In some embodiments, a Z direction is a direction that is orthogonal to a surface of the current measurement device. In some embodiments, the method comprises determining a third scanning position (Y3) where a current detected by the current measurement device is a maximum while the current measurement device is at a third Z position (Z3); and using Y1, Y2, Y3, Z1, Z2 and Z3 to determine a line of best fit, wherein a slope of the line of best fit is used to determine the angle of incidence of the ion beam. In some embodiments, determining a first scanning position comprises: moving the current measurement device to the first Z position (Z1) using a Z direction motor; actuating a scanning motor such that the current measurement device moves in a scanning direction while at the first Z position (Z1); and recording a detected current at a plurality of scanning positions while the current measurement device is moving; and determining a second scanning position comprises: moving the current measurement device to the second Z position (Z2) using the Z direction motor; actuating the scanning motor such that the current measurement device moves in the scanning direction while at the second Z position (Z2); and recording a detected current at a plurality of scanning positions while the current measurement device is moving. In some embodiments, the method comprises using current measurements taken by the current measurement device at a plurality of scanning positions at position Z1 and position Z2 to determine an angular spread of the ion beam.

BRIEF DESCRIPTION OF THE FIGURES

For a better understanding of the present disclosure, reference is made to the accompanying drawings, which are incorporated herein by reference and in which:

FIG. 6 shows a process that the controller may execute to determine the angle of incidence of the ion beam according to one embodiment.

DETAILED DESCRIPTION

Figure 1:
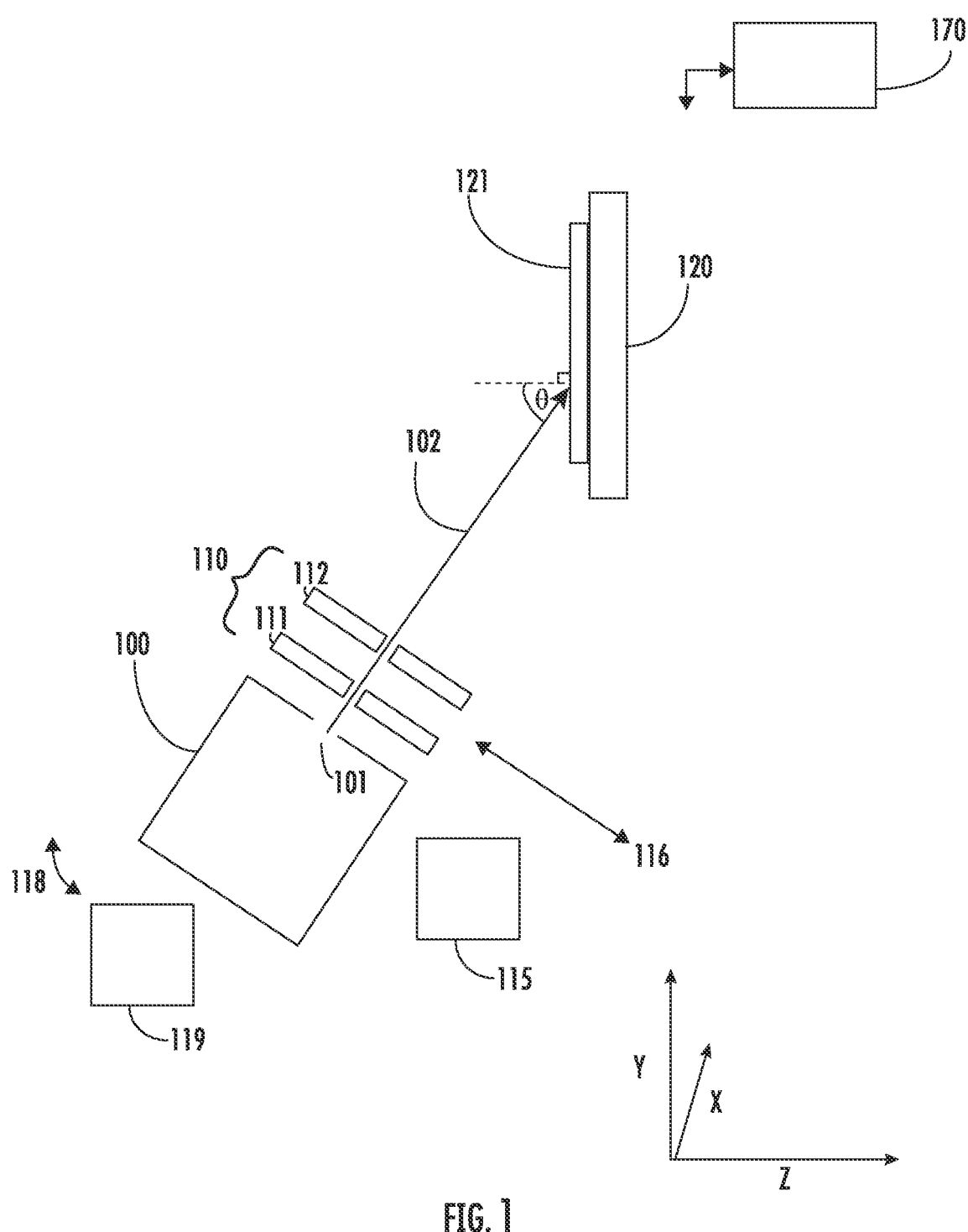
FIG. 1 shows a processing system that may utilize the current measurement device described herein.

FIG. 1 shows a processing system that includes a current measurement device which is capable of measuring the angle of incidence of an incoming ion beam.

The processing system includes an ion source 100. In one embodiment, ion source 100 comprises an outer housing, which may be rectangular, although other shapes are also possible. The outer housing may be constructed of aluminum or some other suitable material. Within the outer housing is an antenna, which may be surrounded by a protective cover. The antenna may be constructed of a conductive material, such as a metal and may be U-shaped. The antenna is coated with, or coaxial within, a protective cover, which may be a ceramic material to protect the antenna from the plasma generated within the ion source 100. The outer housing includes an extraction aperture 101, through which the ion beam 102 exits the ion source 100 and is directed toward the workpiece 121. In operation, a process gas is introduced into the volume defined by the outer housing. The antenna is energized using an RF power source. This energy creates a plasma within the ion source 100. Ions then exit the ion source 100 via the extraction aperture 101.

In another embodiment, the ion source 100 may have the antenna disposed outside the outer housing. The antenna is energized using an RF power source. For example, the wall proximate to the antenna may be a dielectric material so that energy from the antenna passes through the wall and into the volume defined by the outer housing. A process gas is introduced into this volume and when energized, creates a plasma. The ions from the plasma then exit the ion source 100 via the extraction aperture 101.

Other types of devices may be used for the ion source 100. For example, an indirectly heated cathode (IHC) ion source may be used. Alternatively, a Bernas source may be used. In another embodiment, an inductively coupled plasma (ICP) or capacitively coupled plasma (CCP) source may be used. Thus, the ion source 100 is not limited to those shown in FIGS. 1 and 2A-2B.

Extraction optics 110, which may include a suppression electrode 111 and a ground electrode 112, may be disposed outside the extraction aperture 101. The suppression electrode 111 may be negatively biased relative to the ion source 100 so as to attract positive ions from within the ion source 100 and create the ion beam 102. In some embodiments, a extraction optics motor 115 is used to move the extraction optics 110 along a steering direction 116. This direction may correspond to the height direction of the ion beam 102.

Figure 2A:
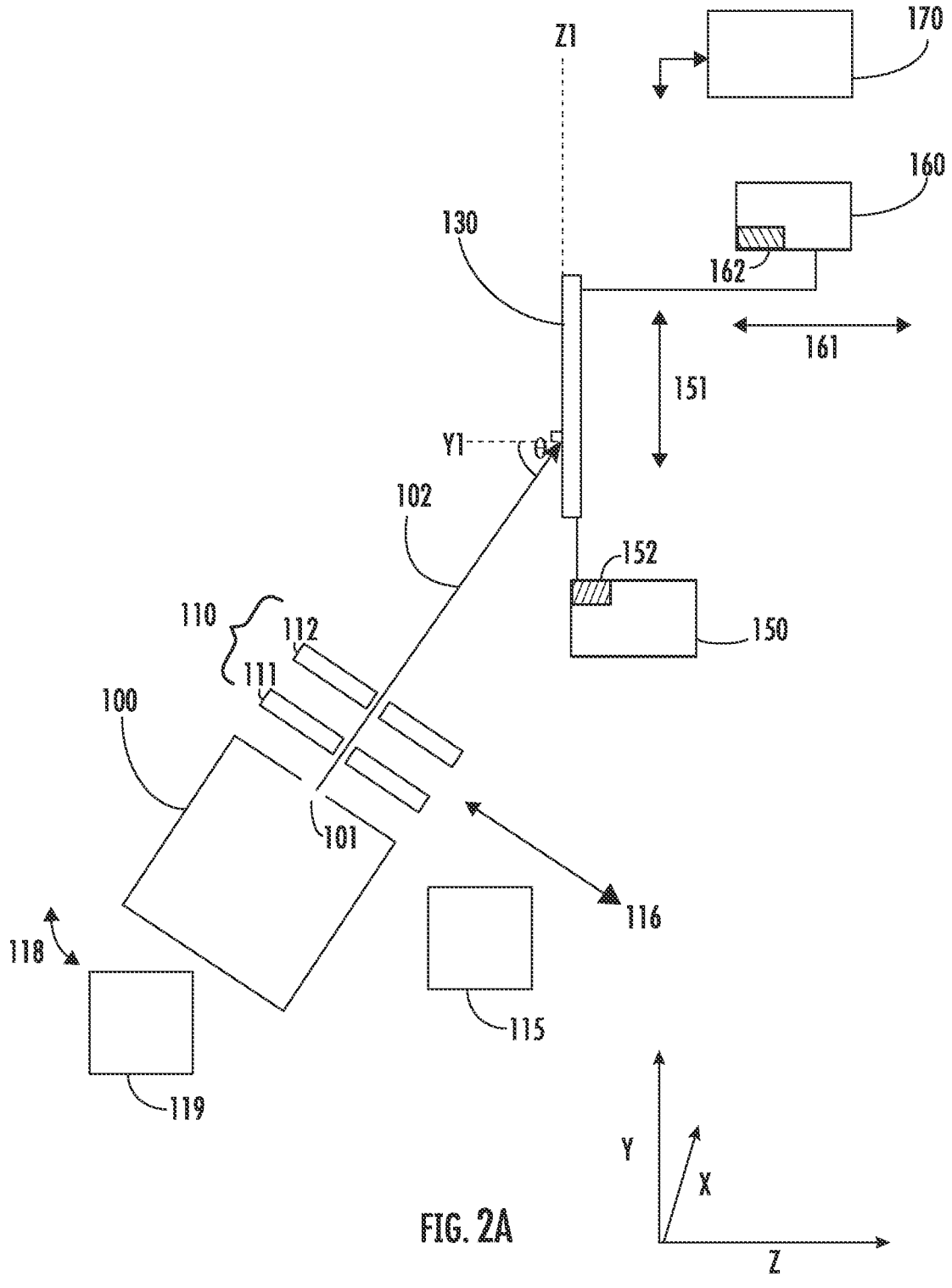
FIG. 2A shows the processing system with the current measurement device disposed in a first position.
Figure 2B:
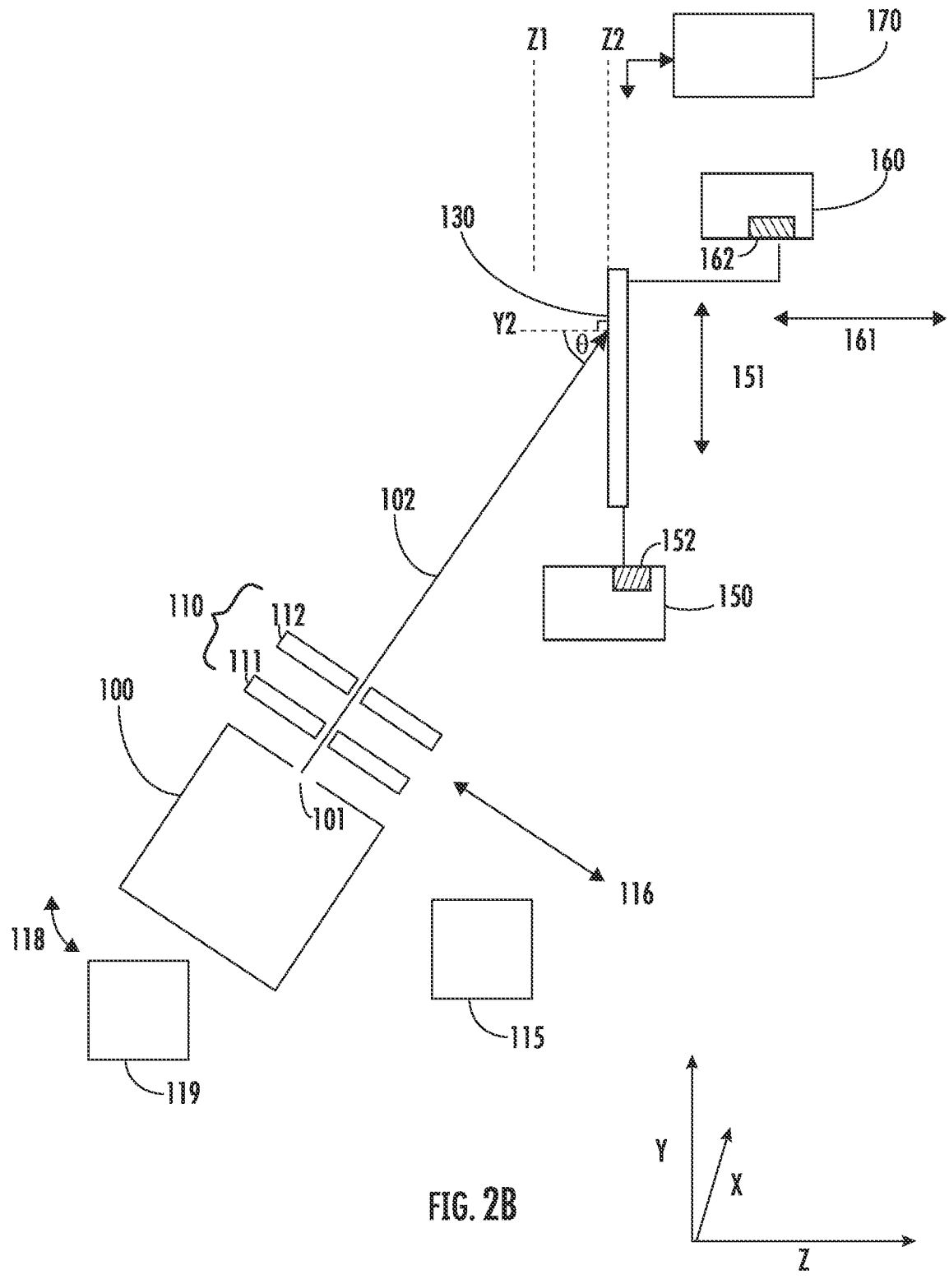
FIG. 2B shows the processing with the current measurement device disposed in a second position.

The ion beam 102 that exits the ion source 100 may be a ribbon beam, having a width that is much greater than its height. For example, the width of the ion beam 102 may be larger than the diameter of the workpiece 121 which it impacts. In other embodiments, the ion beam 102 may be a spot beam. In FIGS. 1 and 2A-2B, the width direction is referred to as the X direction and extends into the page.

In the region where the ion beam 102 is directed, there is a platen 120 to which a workpiece 121 is clamped. The workpiece 121 is processed by the ion beam 102. The workpiece 121 may be a semiconductor workpiece, such as a silicon wafer, a GaN wafer, a SiC wafer or another semiconductor material. Additionally, the workpiece 121 may be a different type of material, such as a glass substrate. Thus, the processing system may be used to process various types of workpieces and the type of workpiece is not limited by this disclosure. The platen 120 may be configured to move in at least one direction, which is the direction that corresponds to the height of the ion beam 102.

Additionally, as shown in FIGS. 2A-2B, in the vicinity of the platen 120 is the current measurement device 130. In some embodiments, the current measurement device 130 may be affixed to the platen 120, such that the current measurement device 130 moves with the platen 120. In this way, the same motors may be used to move both the platen 120 and the current measurement device 130. In another embodiment, the platen 120 may be moved to a nonoperational position, and the current measurement device 130 may be disposed in the position that is occupied by the platen 120 when operational. In this embodiment, the orientation of the current measurement device 130 is the same as that of the platen 120. In other words, the front surface of the current measurement device 130 may be coplanar with the workpiece 121, when the workpiece 121 is in the operational position. In another embodiment, the front surface of the platen 120 (when in the operational position) and the front surface of the current measurement device 130 may be parallel to one another.

Additionally, the current measurement device 130 may be electrically connected to the same bias voltages as the platen 120. For example, if, during normal operation, the platen 120 is grounded, the current measurement device 130 is also grounded. If, during normal operation, the platen 120 is biased at an extraction voltage, the current measurement device 130 may also be connected to this extraction voltage.

Figure 3:
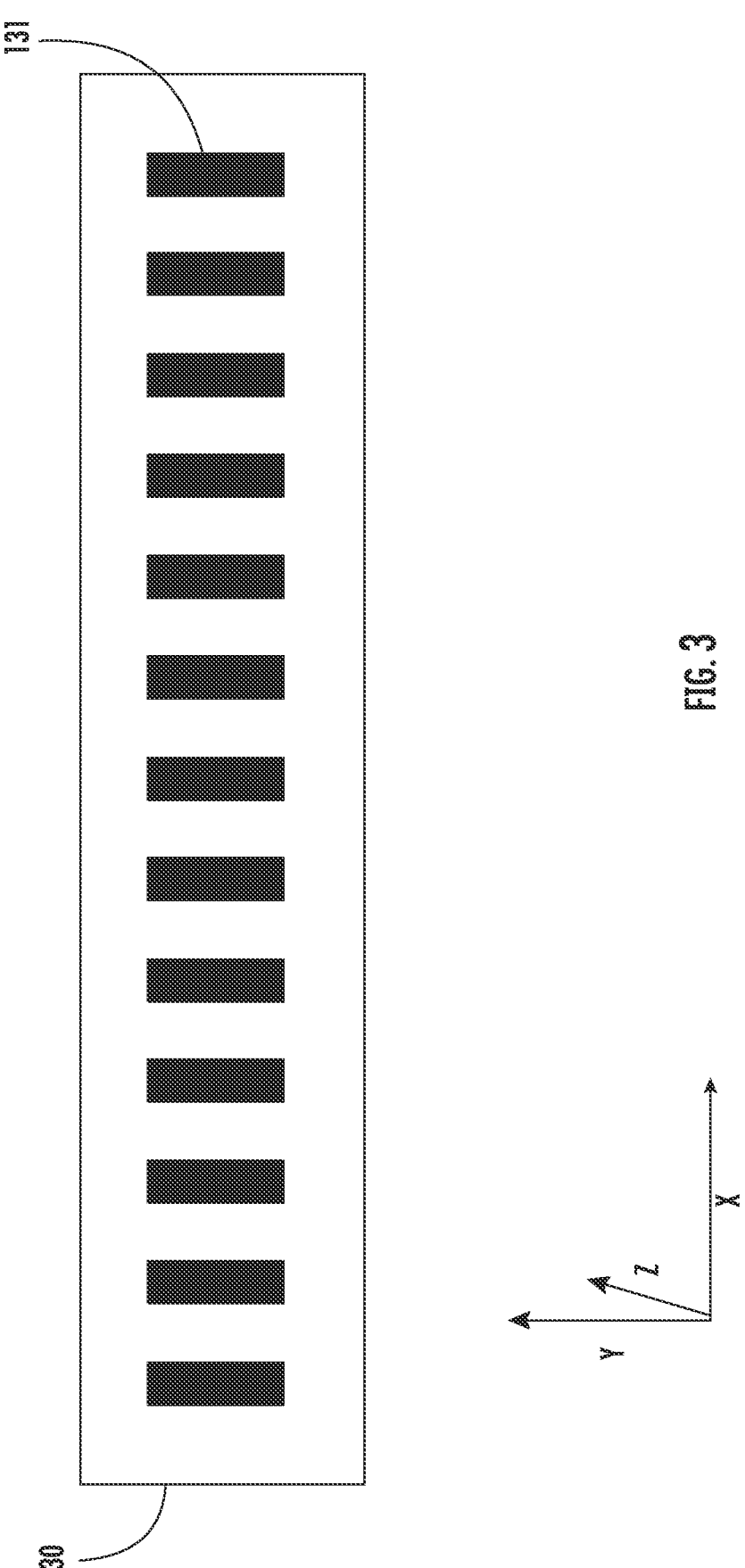
FIG. 3 shows the current measurement device according to one embodiment.

As shown in FIG. 3, the current measurement device 130 may comprise a plurality of current sensors 131, which may be Faraday sensors. These current sensors 131 may be arranged in the direction that corresponds to the width of the ion beam 102. In this way, each current sensor 131 receives a portion of the ion beam 102 and the uniformity of the ion beam 102 along its width may be measured. In some embodiments, there may be twenty or more current sensors 131 distributed along the width direction of the ion beam 102. The number of current sensors 131 and the width of each current sensor 131 affects the resolution of the data in the width direction. The size of the current sensors in the scanning direction 151 changes the resolution of the data that may be obtained in the scanning direction (see FIGS. 4A-4B).

The current measurement device 130 may be configured to be movable in at least two directions. First, the current measurement device 130 is able to move in the direction that is orthogonal to the width of the ion beam 102. This direction may be referred to as the scanning direction 151. The scanning direction 151 may be parallel to the front surface of the current measurement device 130. A scanning motor 150 is in communication with the current measurement device 130 so as to move it along the scanning direction 151 while beam current is measured as a function of scanning position. In some embodiments, this scanning motor 150 is also used to translate the platen 120 in the scanning direction 151. Further, the scanning motor 150 may include an encoder 152 or another similar component that determines the position in the scanning direction 151, also referred to as the scanning position. In some embodiments, the encoders 152 may have resolution to less than 0.1 mm. However, for some embodiments, data collection taken at 0.5 mm intervals in the scanning direction 151 may be sufficient. Of course, larger or smaller intervals may be used.

Additionally, the current measurement device 130 is configured to move in a second direction, which may be perpendicular to the scanning direction 151 and the direction that corresponds to the width of the ion beam 102. In some embodiments, this direction is perpendicular to the surface of the current measurement device 130 and the workpiece 121 that is to be processed. This direction may be referred to as the Z direction 161. A Z direction motor 160 is used to move the current measurement device 130 in the Z direction 161. Further, the Z direction motor 160 may include an encoder 162 or another similar component that determines the position in the Z direction 161, also referred to as the Z position. The resolution of the encoder 162 may be similar to that described for encoder 152 above.

Additionally, the processing system includes a controller 170. The controller 170 may be in communication with the scanning motor 150, the Z direction motor 160, the current measurement device 130, the extraction optics motor 115 and the encoders. The controller 170 may include a processing unit, such as a microcontroller, a personal computer, a special purpose controller, or another suitable processing unit. The controller 170 may also include a non-transitory storage element, such as a semiconductor memory, a magnetic memory, or another suitable memory. This non-transitory storage may element contain instructions and other data that allows the controller 170 to perform the functions described herein.

FIG. 2A shows the current measurement device 130 disposed at a first position in the Z direction 161, labelled Z1. The ion beam 102 is directed toward the current measurement device 130. The current measurement device 130 is then moved in the scanning direction 151 by the scanning motor 150. As noted above, the height of the ion beam 102 may be much smaller than its width. Further, the range of the scanning motor 150 in the scanning direction 151 is much greater than the height of the ion beam 102. Thus, as the current measurement device 130 is moved in the scanning direction 151, it may be disposed in scanning positions where the ion beam 102 does not impact the current sensors 131. However, the current measurement device 130 may then continue to move and reach a scanning position where the ion beam 102 is impacting the current sensors 131. Further, as the current measurement device 130 continues to move along the scanning direction 151, it may again be disposed in scanning positions where the current sensors 131 are not impacted by the ion beam 102.

Figure 4A:
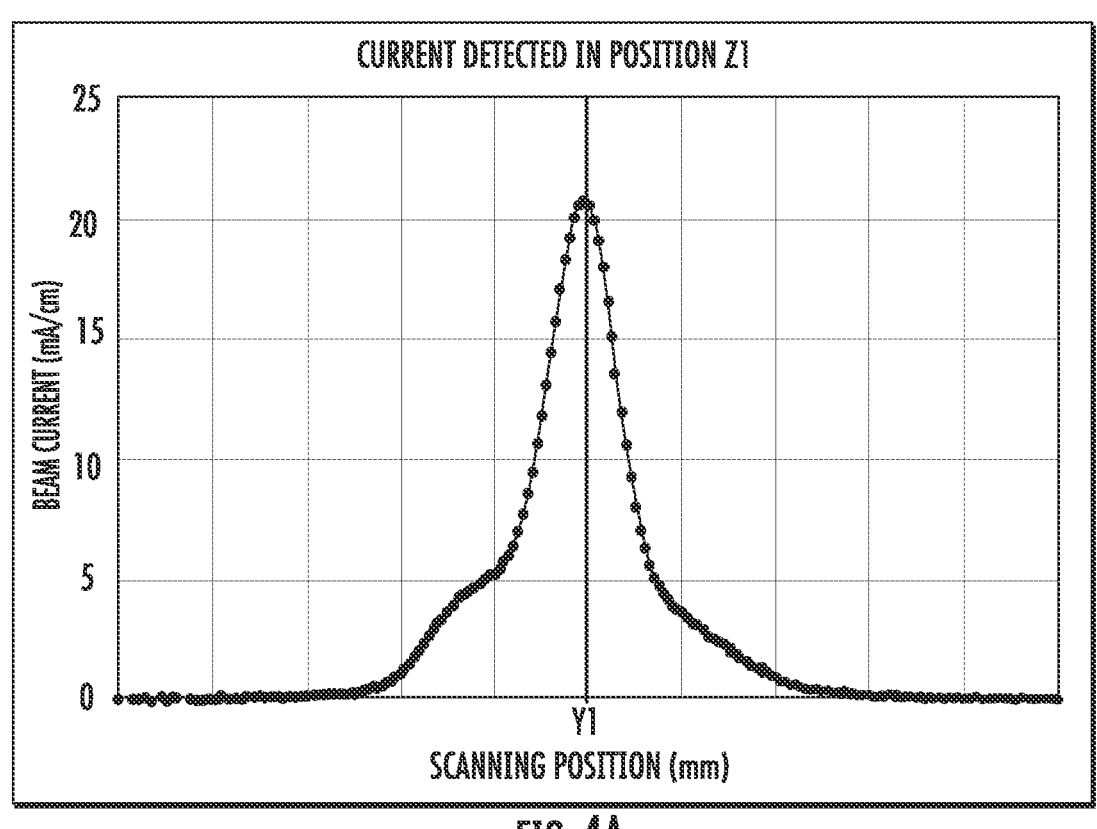
FIG. 4A-4B show the output of the current measurement device as a function of position in the scanning direction.
Figure 4B:
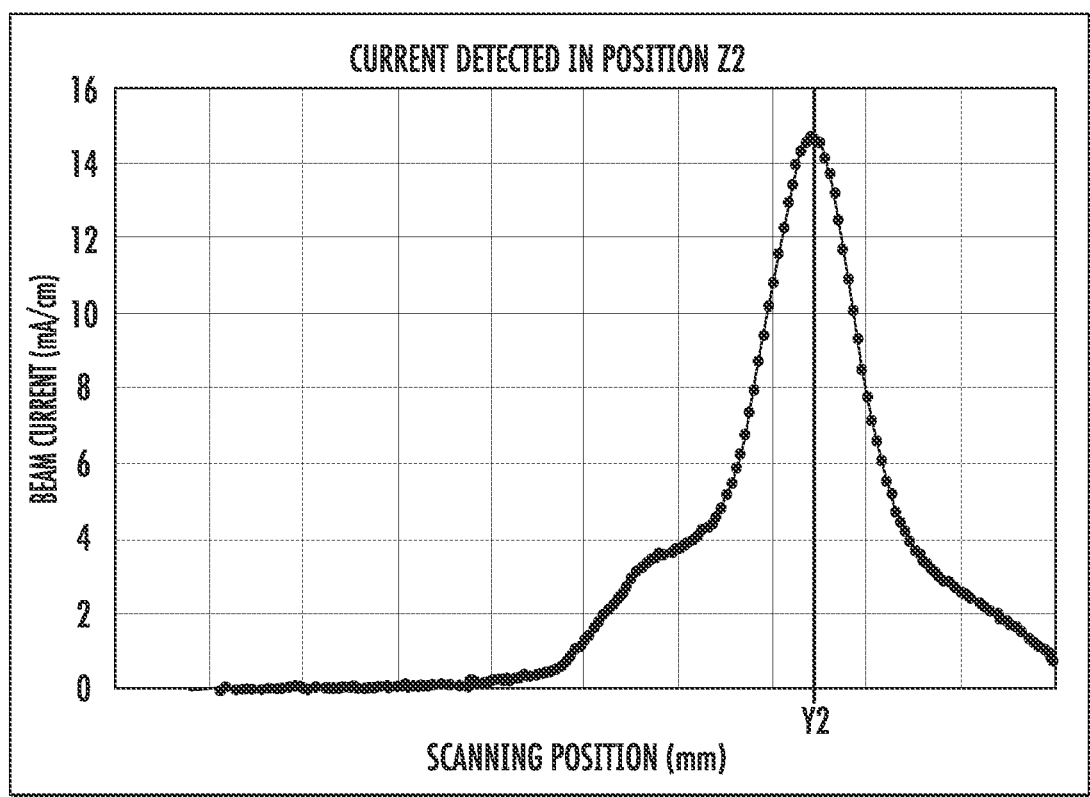

FIG. 4A shows a representative output from the current measurement device 130 while in the first Z position. In FIGS. 4A-4B, the horizontal axis represents the position in the scanning direction 151 (i.e., the scanning position) and the vertical axis represents the current detected at that scanning position. The current detected may be the sum of the current detected by all of the current sensors 131, may be an average of the current detected by each current sensor 131, or may be calculated a different way. In each embodiment, this value is representative of the current that is detected by the current measurement device 130 at that scanning position. Note that, as described above, the measured current is nearly zero when the ion beam 102 is not impacting the current sensors 131, then increases as a portion of the ion beam 102 impacts the current sensors 131. The measured current reaches its maximum value when there is maximum overlap between the current sensors 131 and the ion beam 102. As the current measurement device 130 continues moving in the scanning direction 151, it moves away from the ion beam 102 and the measured current decreases again. Note that in this illustration, when in the first Z position, the maximum current was observed at a scanning position defined as Y1, where $Y_i$ is defined as the scanning position having the maximum current when the current measurement device 130 is at position $Z_i$. Note that both $Y_i$ and $Z_i$ may be measured in millimeters.

FIG. 2B shows the current measurement device 130 disposed at a second position in the Z direction 161, labelled Z2. For reference, the first Z position, Z1, is also labelled. The 10 scanning procedure described above is then repeated at this second Z position. Note that since the second Z position is further from the ion source 100, the ion beam 102 travels further, and impacts the current measurement device 130 at a different location in the scanning direction 151.

FIG. 4B is a graph, similar to FIG. 4A, which illustrates the measured current as a function of scanning position when the current measurement device 130 is in the second Z position (Z2). Note that as described above, the maximum measured current occurs at a different position in the scanning direction 151. In this illustration, the maximum current is measured at a scanning position of Y2.

This information may be used to determine the angle at which the ion beam 102 impacts the current measurement device 130 (and similarly the workpiece 121).

Figure 5:
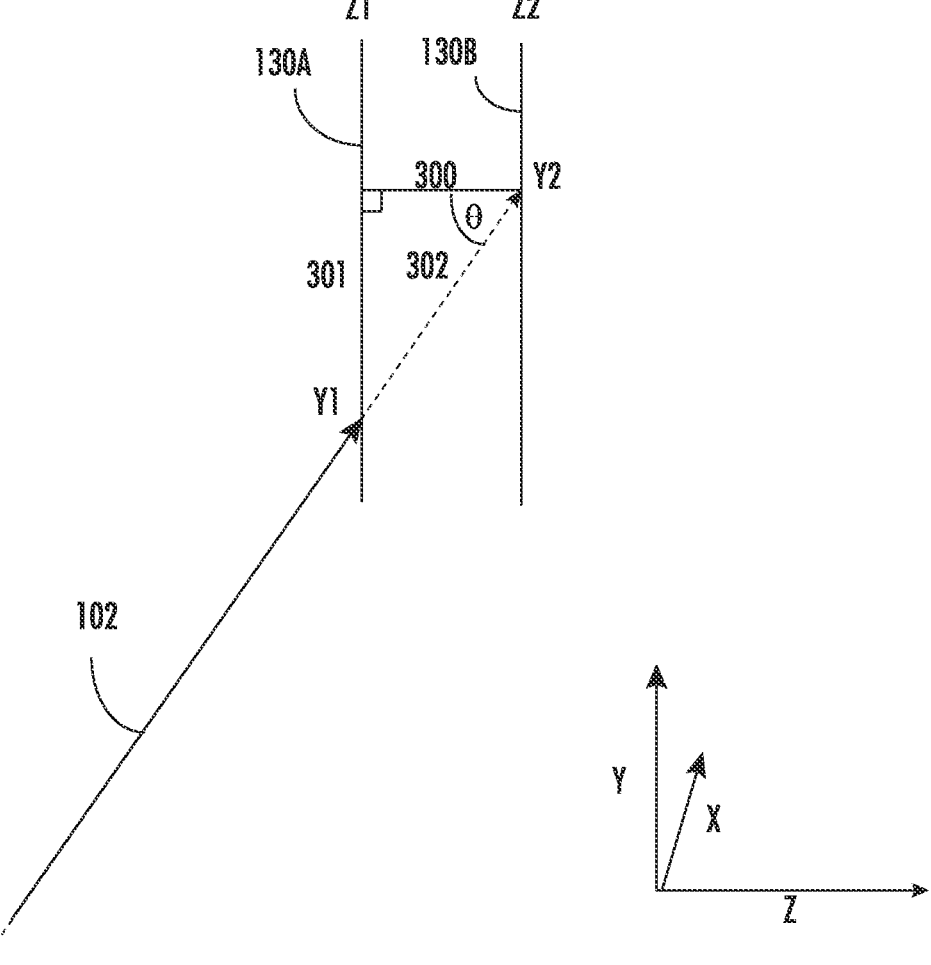
FIG. 5 shows a representation of the measurements taken at the first position and the second position displayed together.

FIG. 5 shows an illustration that includes the ion beam 102, the current measurement device 130*a* when in the first Z position, and the current measurement device 130*b* when in the second Z position. Note that a triangle is formed having a first leg 300, a second leg 301 and a hypotenuse 302, where the hypotenuse is the ion beam 102. Note that the length of the first leg 300 may be defined as the difference in the Z position (Z2-Z1). Similarly, the length of the second leg 301 is defined as the scanning position associated with each Z position that yielded the maximum current, defined as Y2-Y1. The angle of incidence is typically measured in relation to a line that is normal to the workpiece. In other words, the angle of incidence is defined as 90° minus the angle between the ion beam 102 and the scanning direction 151. This angle can be defined as follows:

$$\tan(\theta) = \frac{\text{side } 301}{\text{side } 300} = \frac{Y2 - Y1}{Z2 - Z1} \text{ or } \theta = \arctan\left(\frac{Y2 - Y1}{Z2 - Z1}\right)$$

The procedure that is used by the controller 170 to determine this angle of incidence is shown in FIG. 6. First, as shown in Box 600, the controller 170 instructs the Z direction motor 160 to move the current measurement device 130 to a first Z position, referred to as Z1. Once at position Z1, the controller 170 then instructs the scanning motor 150 to move in the scanning direction 151 along its range of motion as shown in Box 610. In some embodiments, the scanning motor may travel from one end of its range to the opposite end and stop. In other embodiments, the scanning motor 150 may move along its range of motion a plurality of times. In this scenario, the currents measured during each scan at each scanning position may be averaged. The controller 170 uses the scanning position (which may be from encoder 152) and the current measurement from the current measurement device 130 to determine the scanning position with the greatest detected current. This scanning position is referred to as Y1. The controller 170 then instructs the Z direction motor 160 to move the current measurement device 130 to a second Z position, referred to as Z2, as shown in Box 620. Next, as shown in Box 630, the controller 170 instructs the scanning motor 150 to scan in the scanning direction to determine the scanning position with the greatest detected current, referred to as Y2. Finally, the controller 170 uses the difference between Y2 and Y1 and the difference between Z2 and Z1 to calculate the angle of incidence, as shown in Box 640 and explained above.

Figure 7:
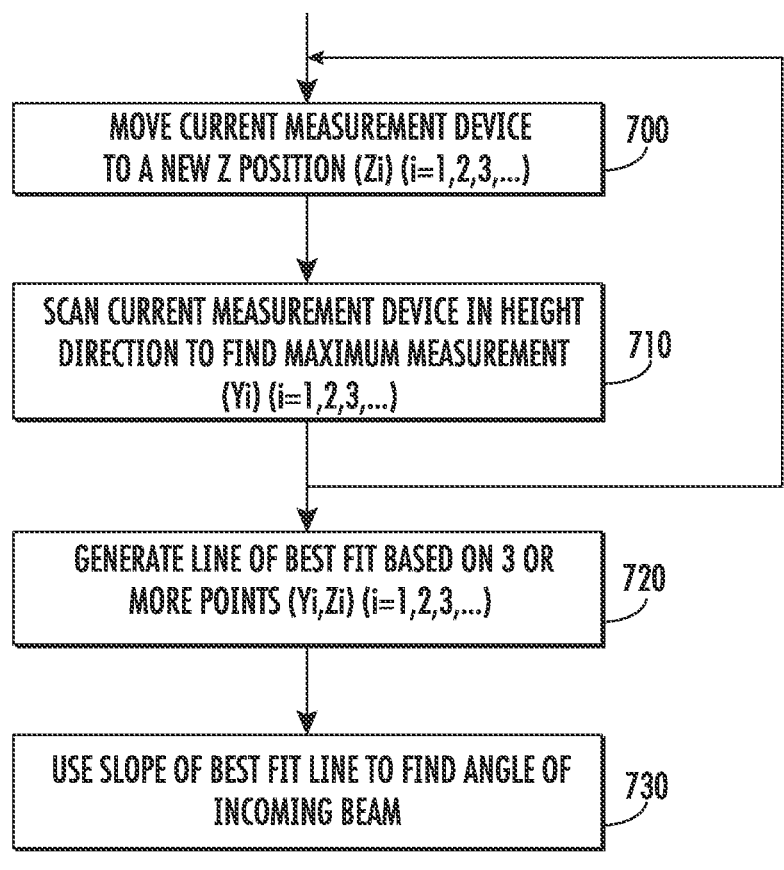
FIG. 7 shows a process that the controller may execute to determine the angle of incidence of the ion beam according to another embodiment.

Note that there are variations of this procedure that may be used. While FIG. 6 relies on exactly 2 different Z positions to calculate the slope of the ion beam 102, in other embodiments, additional measurements may be performed. FIG. 7 shows one such variation. In this procedure, the controller 170 moves the current measurement device 130 to a first Z position using the Z direction motor 160, as shown in Box 700. The controller 170 then determines the scanning position that results in the greatest detected current, as shown in Box 710. This may be done using the technique described above. This sequence is repeated at least 3 times, which results in a plurality of scanning positions, Yi, where each corresponds to the greatest detected current at a corresponding Z position, Zi. These set of points can then be used to find a line of best fit, as shown in Box 720. Techniques for determining a line of best fit are well known and will not be described in detail herein. In some embodiments, the line of best fit is found using linear regression. As shown in Box 730, once this line of best fit is determined, the slope of that line may be used to determine the angle of incidence, using the tangent relationship described above. This approach may improve the accuracy of the calculation.

This measured angle of incidence may be used in several ways. In one embodiment, this measured angle of incidence may be measured before or after a particular process is performed on the workpiece. This may be to verify or validate that the proper angle was used. In another embodiment, this measured angle of incidence may be used to rotate the ion source 100 until a desired angle is achieved. This rotation 118 (see FIG. 1) may be manual or automated. For example, a motor 119 may be used to rotate a least a portion of the ion source 100 and its associated extraction optics 110 so as to change the angle of incidence. In one embodiment, the entire ion source is rotated. In another embodiment, the extraction aperture 101 of the ion source is rotated. In yet another embodiment, the controller 170 may use the measured angle of incidence to adjust the extraction optics 110 of the ion source 100. Specifically, there may be an extraction optics motor 115. This motor is configured to move the extraction optics 110 in a direction that corresponds to the height of the ion beam 102, referred to as the steering direction 116. As can be readily seen in FIGS. 2A-2B, movement of the extraction optics 110 in the steering direction 116 will alter the path of the ion beam 102, causing the angle of incidence to increase or decrease. Thus, in certain embodiments, there may be a control loop wherein the controller 170 uses the measured angle of incidence to adjust the extraction optics 110 using the extraction optics motor 115. In some embodiments, this may be an open loop control loop, wherein the difference between the measured angle of incidence and the desired angle of incidence is used to determine the amount of movement of the extraction optics 110. In another embodiment, this may be a closed control loop, wherein the extraction optics 110 are moved based on a difference between the measured angle of incidence and the desired angle of incidence, and then the procedure shown in FIG. 6 or FIG. 7 is repeated. This results in an updated measured angle of incidence, which is then used to further adjust the position of the extraction optics 110. This may be iterated a plurality of times if desired. In another embodiment, this control loop may be used to control the rotation 118 of the ion source 100.

Other variations of this approach are also possible. For example, while FIG. 3 shows a current measurement device 130 that includes a plurality of current sensors 131, this procedure may be performed even if the current measurement device 130 has a single current sensor 131.

In another embodiment, the current measurement device 130 may be configured such that there is a column of current sensors 131 that are arranged in the scanning direction 151. If the current measurement device 130 is sufficiently large in the scanning direction, it may be possible to detect the greatest measured current without moving the current measurement device in the scanning direction 151. In this scenario, the current measurement device 130 may be one column of current sensors 131, or may be a two dimension array of current sensors 131 that allow measurement in both the width direction and the scanning direction.

The current measurement device 130 described above may be used for other applications as well. For example, the results at two or more different Z positions may be used to determine angular spread of the ion beam 102. In one embodiment, the measurements described in FIG. 6 are performed. However, rather than only comparing the Y values at the scanning position with the maximum current, calculations are performed at other points as well. For example, the graphs of FIGS. 4A-4B may be analyzed to determine the $10^{th}$ percentile, $20^{th}$ percentile, the $80^{th}$ percentile, the $90^{th}$ percentile and others. In one embodiment, this may be done by calculating the total area beneath each graph and then finding the Y position where the area under the curve up to that Y position is equal to a predetermined percentage of the total area. As an example, the scanning position that achieves 10% of the total area under the curve may be determined for the two graphs. The calculations shown above may then be used to measure the angle of incidence of the $10^{th}$ percentile. The same sequence may be followed to find the angle of incidence for other percentiles. Based on these results, the spread of angles, not just the central angle, may be determined. For example, the scanning position for the $10^{th}$ percentile and the $90^{th}$ percentile may be determined at two different Z positions. In another embodiment, the selected percentiles may be $20^{th}$ and $80^{th}$, $25^{th}$ and $75^{th}$, or some other combination. Using these four scanning positions and two Z positions, the angular spread of the ion beam may be calculated. For example, the difference between the scanning positions for the two percentiles at each Z position may be compared to determine the angular spread. Alternatively, the angle of incidence of the two percentiles can be calculated to determine the angular spread. In other embodiments, more percentiles may be used, such as every $10^{th}$ percentile, to develop a more accurate model of the angular spread of the ion beam 102. Thus, by using a plurality of current 20 measurements, taken at a plurality of scanning positions at each Z position, the angular spread of the ion beam 102 may be calculated.

Additionally, there may be other embodiments. FIGS. 1, 2A-2B show an ion source 100 with extraction optics 110 that are disposed near the platen 120. However, the ion beam 102 may be generated using other types of ion sources. For example, in one embodiment, the ion source 100 may not include extraction optics 110. In this embodiment, the current measurement device 130 may be biased to the same voltage that is used by the platen so as to emulate the ion beam that is generated in normal operation. In another embodiment, the ion beam 102 may be the output from a beam line ion implanter that includes a mass analyzer, a mass resolving aperture and one or more beamline components that are used to direct the ion beam 102 toward the platen 120. Thus, in this embodiment, the ion source 100 is part of a beam line ion implanter.

The embodiments described above in the present application may have many advantages. Measurement of the actual angle of incidence of an ion beam may be desirable in certain processes. In many systems, this approach does not utilize any new hardware; since the current measurement device 130, as well as the scanning motor 150 and the Z direction motor 160, are already present. Note that this approach is also able to measure angles of incidence as long as the ion beam impacts the current measurement angle at an angle that is not perpendicular to the current measurement device. Further, this approach is able to measure very large angles of incidence. Specifically, in this approach, the greater the beam angle, the more accurate the measurement. This increase in accuracy is a result of a larger change in scanning position for the same change in Z position as the beam angle increases. This approach may be ideal for larger beam angles which are difficult to measure with other techniques. Additionally, as explained above, this approach may also be used to determine angular spread of the ion beam 102.

Further, this approach may be very accurate. In the example shown in FIGS. 4A-4B, the ion beam 102 was set to a 60° angle. The techniques described above calculated this angle to be 59.7°, which represents an error of less than 1%.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A processing system, comprising:
an ion source to create an ion beam having a width and a height;
a current measurement device wherein the ion beam is directed toward the current measurement device and impacts the current measurement device at an angle different from a perpendicular angle;
a scanning motor to move the current measurement device in a direction that is orthogonal to the width of the ion beam, referred to as a scanning direction, wherein a position of the current measurement device in the scanning direction is referred to as a scanning position;
a Z direction motor to move the current measurement device in a direction that is orthogonal to a surface of the current measurement device; and
a controller configured to:
move the current measurement device to a first position in a Z direction (Z1) using the Z direction motor;
determine a first scanning position (Y1) that results in a greatest detected current while the current measurement device is located at the first position in the Z direction (Z1);
move the current measurement device to a second position in the Z direction (Z2) using the Z direction motor;
determine a second scanning position (Y2) that results in a greatest detected current while the current measurement device is located at the second position in the Z direction (Z2); and
use Y1, Y2, Z1 and Z2 to determine an angle of incidence of the ion beam.

2. The processing system of claim 1, wherein the controller determines a scanning position that results in the greatest detected current by actuating the scanning motor such that the current measurement device moves in the scanning direction, and recording a detected current at a plurality of scanning positions while the current measurement device is moving.

3. The processing system of claim 1, wherein the angle of incidence is calculated based on a ratio of (Y2-Y1) to (Z2-Z1).

4. The processing system of claim 1, wherein the controller is configured to:

move the current measurement device to at least one additional position in the Z direction (Z3) using the Z direction motor;

determine at least a third scanning position (Y3) that results in a greatest detected current while the current measurement device is located at the at least one additional position; and create a line of best fit using values of Z1, Z2, Z3, Y1, Y2 and Y3, wherein a slope of the line of best fit is used to determine the angle of incidence.

5. The processing system of claim 1, further comprising extraction optics disposed outside an extraction aperture of the ion source, wherein the controller uses the angle of incidence to move the extraction optics to achieve a desired angle of incidence.

6. The processing system of claim 1, further comprising a motor to rotate at least a portion of the ion source, wherein the controller uses the angle of incidence to rotate at least the portion of the ion source to achieve a desired angle of incidence.

7. The processing system of claim 1, wherein the controller is configured to:

collect a plurality of current measurements taken at a plurality of scanning positions while the current measurement device is at the first position in the Z direction (Z1) and the second position in the Z direction (Z2); and calculate an angular spread of the ion beam based on the plurality of current measurements.

8. The processing system of claim 1, wherein the controller is configured to:

determine a third and fourth scanning position (Y3, Y4) that result in a detected current equal to two predetermined percentages of a total beam current while the current measurement device is located at the first position in the Z direction (Z1);

determine a fifth and sixth scanning position (Y5, Y6) that results in a detected current equal to the two predetermined percentages of the total beam current while the current measurement device is located at the second position in the Z direction (Z2); and calculate an angular spread of the ion beam based on Y3, Y4, Y5, Y6, Z1 and Z2.

9. The processing system of claim 1, wherein the current measurement device comprises an array of Faraday sensors arranged in a width direction of the ion beam.

10. The processing system of claim 1, wherein the ion source is part of a beam line ion implanter.

11. The processing system of claim 1, wherein the angle of incidence is defined as 90° minus the angle between the ion beam and the scanning direction.

12. The processing system of claim 1, further comprising a workpiece holder in communication with the scanning motor and the Z direction motor, wherein the current measurement device is affixed to the workpiece holder.

13. A method of determining an angle of incidence of an ion beam, comprising:

determining a first scanning position (Y1) where a current detected by a current measurement device is a maximum while the current measurement device is at a first Z position (Z1);

determining a second scanning position (Y2) where a current detected by the current measurement device is a maximum while the current measurement device is at a second Z position (Z2); and using Y1, Y2, Z1 and Z2 to determine the angle of incidence of the ion beam.

14. The method of claim 13, wherein the angle of incidence is calculated based on a ratio of (Y2-Y1) to (Z2-Z1).

15. The method of claim 13, wherein a Z direction is a direction that is orthogonal to a surface of the current measurement device.

16. The method of claim 13, further comprising:

determining a third scanning position (Y3) where a current detected by the current measurement device is a maximum while the current measurement device is at a third Z position (Z3); and using Y1, Y2, Y3, Z1, Z2 and Z3 to determine a line of best fit, wherein a slope of the line of best fit is used to determine the angle of incidence of the ion beam.

17. The method of claim 13, wherein determining a first scanning position comprises:

moving the current measurement device to the first Z position (Z1) using a Z direction motor;

actuating a scanning motor such that the current measurement device moves in a scanning direction while at the first Z position (Z1); and recording a detected current at a plurality of scanning positions while the current measurement device is moving; and wherein determining a second scanning position comprises:

moving the current measurement device to the second Z position (Z2) using the Z direction motor;

actuating the scanning motor such that the current measurement device moves in the scanning direction while at the second Z position (Z2); and recording a detected current at a plurality of scanning positions while the current measurement device is moving.

18. The method of claim 13, further comprising using current measurements taken by the current measurement device at a plurality of scanning positions at position Z1 and position Z2 to determine an angular spread of the ion beam.

* * * * *